United States Patent
Elwan

(10) Patent No.: US 10,291,213 B2
(45) Date of Patent: May 14, 2019

(54) FEEDBACK-CONTROLLED CURRENT-SHAPED OUTPUT OF DIGITAL SIGNALS FOR REDUCING MAGNETIC COUPLING

(71) Applicant: GOODIX TECHNOLOGY INC., San Diego, CA (US)

(72) Inventor: Hassan Elwan, Irvine, CA (US)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/782,936

(22) Filed: Oct. 13, 2017

(65) Prior Publication Data
US 2019/0115906 A1   Apr. 18, 2019

(51) Int. Cl.
| | |
|---|---|
| H03K 5/12 | (2006.01) |
| H03K 5/1252 | (2006.01) |
| H03K 19/20 | (2006.01) |
| H03K 17/687 | (2006.01) |
| H03K 5/01 | (2006.01) |

(52) U.S. Cl.
CPC ............ *H03K 5/1252* (2013.01); *H03K 5/01* (2013.01); *H03K 5/12* (2013.01); *H03K 17/687* (2013.01); *H03K 19/20* (2013.01)

(58) Field of Classification Search
CPC ........ H03K 5/1252; H03K 5/01; H03K 19/20; H03K 17/687; H03K 5/1254; H03K 5/12
See application file for complete search history.

(56) References Cited

U.S. PATENT DOCUMENTS

| | | | |
|---|---|---|---|
| 4,622,482 | A | 11/1986 | Ganger |
| 5,877,647 | A | 3/1999 | Vajapey et al. |
| 6,262,617 | B1 | 7/2001 | McClure |
| 6,366,114 | B1 | 4/2002 | Liu et al. |

(Continued)

FOREIGN PATENT DOCUMENTS

CN        100566171 C        12/2009

OTHER PUBLICATIONS

International Search Report dated Jul. 25, 2018 in the corresponding CN application (application No. PCT/2018/085399).

(Continued)

*Primary Examiner* — Jung Kim
(74) *Attorney, Agent, or Firm* — Kilpatrick Townsend & Stockton LLP

(57) ABSTRACT

Various arrangements for decreasing harmonics of an output digital signal are presented. A programmable current rise-time circuit may be present that controls a rising edge of the output digital signal, wherein the output digital signal is output to an input/output (I/O) pad. A programmable current fall-time circuit may be present that controls a falling edge of the output digital signal. A feedback circuit may be present that monitors a rise-time of the rising edge of the output digital signal and fall-time of the falling edge of the output digital signal. A control circuit may be present that provides a first input to the programmable current rise-time circuit to adjust the rise-time of the rising edge of the output digital signal and a second input to the programmable current fall-time circuit to adjust the fall-time of the falling edge of the output digital signal.

10 Claims, 10 Drawing Sheets

(56) References Cited

U.S. PATENT DOCUMENTS

| | | | |
|---|---|---|---|
| 7,554,385 B2 * | 6/2009 | Ishida | H02M 3/07 327/170 |
| 2003/0098716 A1 | 5/2003 | Porter et al. | |
| 2005/0231251 A1 | 10/2005 | Im et al. | |
| 2005/0285646 A1 | 12/2005 | Rashid | |
| 2005/0285648 A1 | 12/2005 | Wilson et al. | |

OTHER PUBLICATIONS

European Search Report dated Dec. 19, 2018 in the corresponding EP application(application No. 18765348.0).

* cited by examiner

FEEDBACK-CONTROLLED CURRENT-SHAPED OUTPUT OF DIGITAL SIGNALS FOR REDUCING MAGNETIC COUPLING

BACKGROUND

Integrated circuits (ICs) may be connected with input/output (I/O) pads through which digital signals can be output to other circuits on a printed circuit board (PCB). Such an I/O pad that is connected with a digital output of an IC is also typically connected to a capacitor. When the digital output signal transitions high or low, current may briefly pass through the circuit created between the capacitor, the I/O pad that is connected with the digital output of the IC, and ground. This current generates a magnetic loop. This magnetic loop can then induce current in another nearby circuit. This induced current can negatively affect such nearby circuits, especially if the nearby circuit is a low-noise circuit, such as an antenna receiver circuit. Therefore, it may be beneficial to reduce the effects of such magnetic coupling induced by a digital output.

SUMMARY

When digital I/O pins are present on an SOC chip that includes sensitive RF components, coupling from the digital outputs to the RF circuitry can degrade the sensitivity and noise figure performance of the system. The degradation can be a function of the I/O supply voltage, load capacitance, process variation as well as the propagation delay and rise and fall time of the digital output signal. Embodiments detailed herein may reduce the coupling from the digital I/O pins to the RF circuitry, and may calibrate the digital pad to allow for an increased RF isolation benefit while maintaining a symmetric propagation delay and rise/fall time timing specification in the presence of process, supply and load variation.

The main cause of RF degradation from I/O pads may be caused by the magnetic coupling between the digital output loop and the LNA input loop (or VCO inductor). The coupling can be a function of the digital pad output current waveform (notably, not the voltage waveform). The proposed solution aims at shaping the current waveform of the output pad to reduce the harmonic components at RF frequency and hence reduce the magnetic coupling to the RF circuits.

The current shaping circuitry of embodiments detailed herein may not involve any bias current and may be automatically calibrated to maintain compliance with a known propagation delay specification and an equal rise and fall time. This allows for optimal current shaping of the output currents to be achieved for different load capacitors, supply voltage and process and temperature variations.

Various systems, integrated circuits, methods, and apparatuses for decreasing harmonics of an output digital signal are presented. Such a system, IC, or apparatus may include a programmable current rise-time circuit that controls a rising edge of the output digital signal. The output digital signal may be output to an input/output (I/O) pad. A programmable current fall-time circuit may be present that controls a falling edge of the output digital signal. A feedback circuit may be present that monitors a rise-time of the rising edge of the output digital signal and fall-time of the falling edge of the output digital signal. A control circuit may be present that provides a first input to the programmable current rise-time circuit to adjust the rise-time of the rising edge of the output digital signal and a second input to the programmable current fall-time circuit to adjust the fall-time of the falling edge of the output digital signal.

Embodiments of such systems, integrated circuits, methods and apparatus may include one or more of the following features: The programmable current rise-time circuit, the programmable current fall-time circuit, the feedback circuit, and the control circuit may be integrated as part of an integrated circuit (IC). The IC may include an RF input connected with a low noise amplifier (LNA) of the IC. The control circuit using the programmable current rise-time circuit to increase the rise-time of the rising edge and the programmable current fall-time circuit to increase the fall-time of the falling edge may reduce magnetic coupling between the output digital signal and the RF input. An I/O pad may be present located on a printed circuit board and the I/O pad is electrically connected to one or more capacitors distinct from the IC.

The programmable current rise-time circuit may include: a first p-channel metal-oxide semiconductor field-effect transistor (MOSFET) comprising: a first gate; a first source; and a first drain; an n-channel MOSFET comprising: a second gate; a second source; and a second drain; a second p-channel MOSFET comprising: a third gate; a third source; and a third drain; a capacitor; and a variable resistance network comprising a first terminal and a second terminal. The first gate and the second gate may be electrically connected to a first node. The first node may also electrically connected to a logic circuit of the IC. The first drain, the third gate, the capacitor, and the first terminal of the variable resistance network may be electrically connected to a second node. The second drain and the second terminal may be electrically connected. The third drain may be electrically connected with the I/O pad.

The programmable current fall-time circuit may include: a p-channel metal-oxide semiconductor field-effect transistor (MOSFET) comprising: a first gate; a first source; and a first drain; a first n-channel MOSFET comprising: a second gate; a second source; and a second drain; a second n-channel MOSFET comprising: a third gate; a third source; and a third drain; a capacitor; and a variable resistance network comprising a first terminal and a second terminal. The first gate and the second gate may be electrically connected to a first node. The first node may also be electrically connected to a logic circuit of the IC. The second drain, the third gate, the capacitor, and the first terminal of the variable resistance network may be electrically connected to a second node. The first drain and the second terminal of the variable resistance network may be electrically connected. The third drain may be electrically connected with the I/O pad. The feedback circuit may include an inverter. An input of the inverter may be electrically connected with the I/O pad. An output of the inverter may be electrically connected with the control circuit. The control circuit may determine the first input and the second input at least partially based on the output of the inverter. The feedback circuit may include a first comparator and a second comparator. The first comparator may compare a voltage of the I/O pad with a first threshold. The second comparator may compare the voltage of the I/O pad with a second threshold. A first output of the first comparator and a second output of the second comparator may be electrically connected with the control circuit. The control circuit may determine the first input and the second input at least partially based on the first output and the second output. The variable resistance network may include a control input electrically connected with the control circuit. The programmable current rise-time circuit and the programmable current fall-time circuit does not use any biasing current, hence has little impact on the overall static standby power consumption of the integrated circuit.

DETAILED DESCRIPTION

A digital output of an IC is output to an I/O pad present on a PCB to which the IC is affixed. Typically, the I/O pad is electrically connected with another circuit (e.g., a circuit that uses the digital output as an input) and one or more capacitors. This capacitor may charge when the digital output transitions from a logical zero or low voltage (e.g., 0 V) to a logical one or high voltage (e.g., 1.5 V, 3.3 V, 5 V) and the capacitor may discharge when the digital output transitions from a high voltage to a low voltage. When the capacitor is being charged or discharged, a current is passing through the I/O pad, capacitor, and ground. This current induces a magnetic loop.

Figure 1:
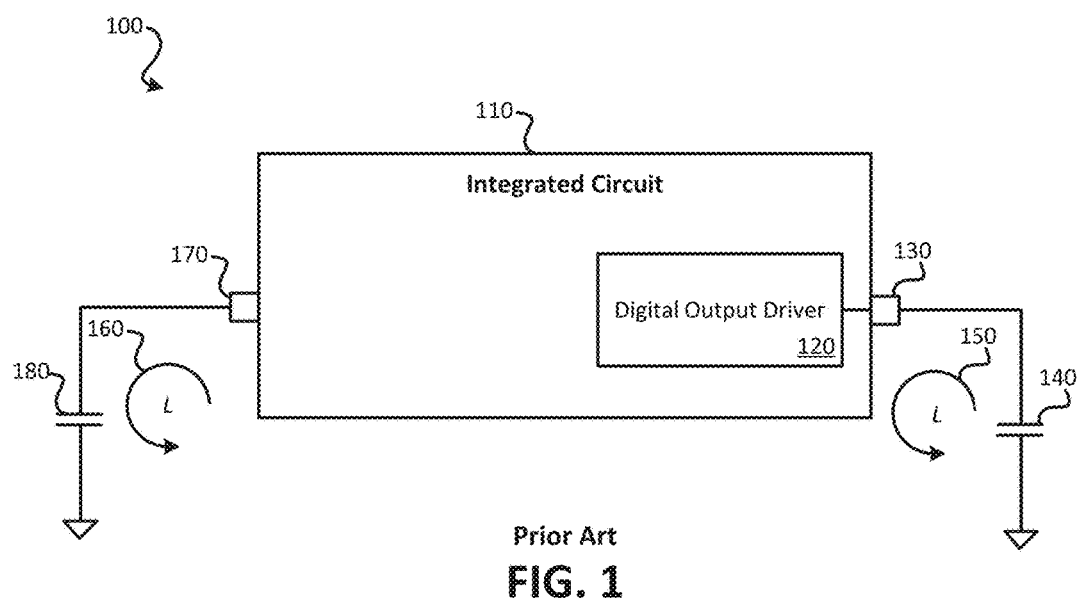
FIG. 1 illustrates an embodiment of magnetic coupling between a digital output and RF componentry of an IC.

This magnetic loop can be seen in FIG. 1. FIG. 1 illustrates an embodiment 100 of magnetic coupling between a digital output and RF componentry of an IC. In FIG. 1, IC 110 has an on-board digital output driver 120 that outputs a digital signal to I/O pad 130. I/O pad 130 may be electrically connected to one or more capacitors, represented by capacitor 140 which can include componentry distinct from a capacitor that effectively provides some amount of capacitance. When digital output driver 120 transitions from outputting a logical zero to a logical one output or from outputting a logical one to a logical zero, capacitor 140 and/or the componentry that effectively provides capacitance may be charged and discharged, respectively.

The digital output driver 120 transitioning from a logical zero to a logical one output or from outputting a logical one to a logical zero, causes a current to charge capacitor 140 or is discharged from capacitor 140. This current, when viewed over time, can be understood as a pulse train. Due to the charge and discharge times of capacitor 140 being short, the current, when analyzed over time, is a pulse train with the pulses having narrow durations. These current pulses, when analyzed in the frequency domain, have harmonics at higher (and/or lower) frequencies, decreasing in magnitude. The pulse train, due to switching between a logical one and logical zero, may have an effective frequency of, for example, 20 MHz. Therefore, harmonic frequencies may occur at frequencies such as 20, 40, 60, 80, 100 MHz and so on.

The current that charges capacitor 140 and is discharged from capacitor 140 may induce magnetic loop 150. Magnetic loop 150 may induce magnetic loop 160 in another circuit. This other circuit may be located nearby, such as in another circuit connected with an I/O pad of IC 110 (e.g., I/O pad 170), or some other circuit that happens to be in proximity to the circuit of I/O pad 130.

By magnetic loop 160 being induced by magnetic loop 150, a current may be induced in the circuit of I/O pad 170 and capacitor 180. Capacitor 180 may represent one or more discrete capacitors and/or componentry that effectively creates capacitance on the circuit electrically connected with I/O pad 170. By virtue of harmonics being present at higher and lower frequencies due to the current pulses and magnetic loop 150, induced magnetic loop 160 can induce current at I/O pad 170 at the same higher and lower harmonic frequencies as present at I/O pad 130.

The magnitude of current at such frequencies induced by induced magnetic loop 160 may be relatively small compared to the current pulses created by digital output driver 120 and capacitor 140. However, depending on the type of componentry connected with I/O pad 170, the induced current at one or more of the harmonic frequencies may be substantial enough to negatively impact functionality of the componentry. For example, if I/O pad 170 is connected with a low noise amplifier (LNA) of IC 110 that receives an RF signal from an antenna (not illustrated) at, such as, 800 MHz, the induced current from induced magnetic loop 160 may degrade the received signal at I/O pad 170.

To decrease the amount of induced current from magnetic loop 160, the current pulses present when the output at I/O pad 130 transitions between logical one and logical zero (and the reverse) may be shaped. When the output of digital output driver 120 transitions between a logical zero and a logical one, by increasing the rise-time of output signal and increasing the fall-time of the current output signal, but not necessary the voltage output waveform, when transitioning between logical one and a logical zero, the harmonics induced by the current is reduced. By the magnitude of current at the harmonic frequencies being reduced at I/O pad 130, the amount of current induced via the magnetic coupling of magnetic loops 150 and 160 is similarly decreased such that a lower amount of current is induced at the harmonic frequencies at I/O pad 170.

While the harmonics at various frequencies are decreased as the rise-time and the fall-time of the current signal at I/O pad 130 is increased, the duration of the voltage rise-time and fall-time may be limited due to requirements of components with which I/O pad 130 is connected. For example, another IC which receives a signal from digital output driver 120 via I/O pad 130 and a trace on the PCB may have a maximum tolerance for voltage rise-time and fall-time. Therefore, despite the decreased current induced at harmonic frequencies, it may not be possible to increase rise-times and fall-times beyond certain thresholds without negatively impacting functionality of a system. Further, other factors can influence rise-time and fall-time, such as operating temperature and supply voltage (battery).

Figure 2:
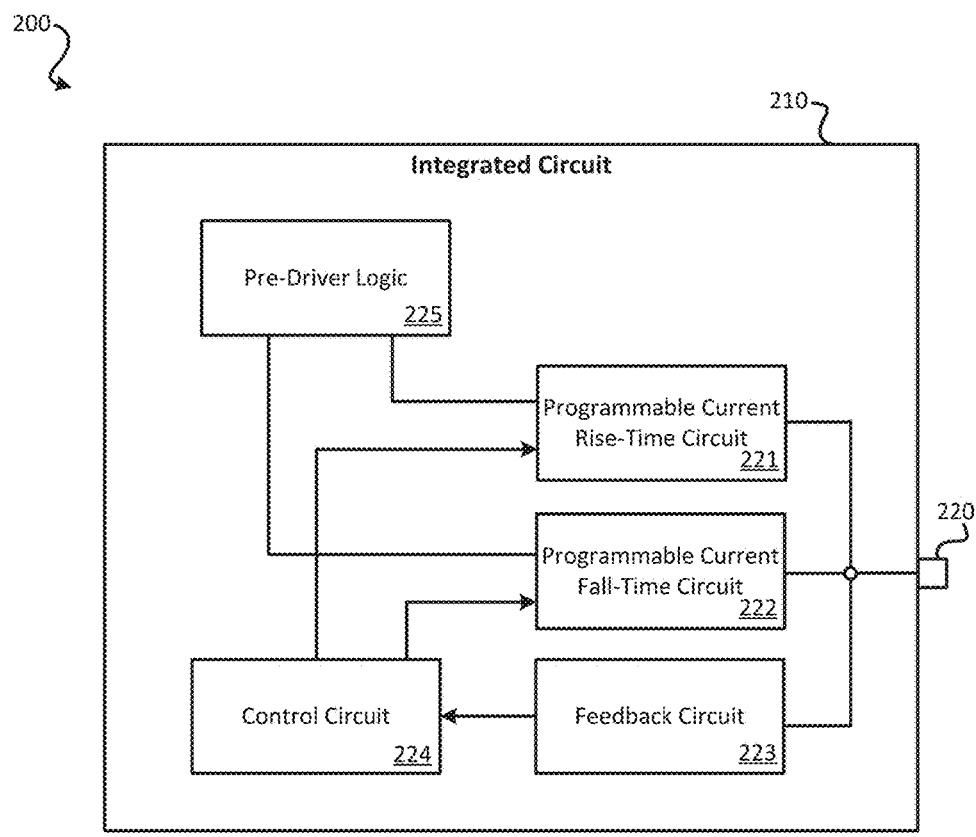
FIG. 2 illustrates an embodiment of a block diagram of an IC having an on-board circuit for decreasing harmonics of an output digital signal.

FIG. 2 illustrates an embodiment 200 of a block diagram of an IC 210 having an on-board circuit for decreasing harmonics of an output digital signal. IC 210 may be attached to a PCB, including I/O pad 220. I/O pad 220 may receive a digital output signal from IC 210. This digital output signal may be output to one or more other circuits. I/O pad 220 may be connected to one or more discrete capacitors and/or componentry that effectively exhibits capacitance. For example, a trace on a PCB may exhibit a capacitance of several picofarads per inch.

Integrated as part of IC 210 is an on-board circuit for decreasing harmonics of an output digital signal. This on-chip circuit may include: programmable current rise-time circuit 221, programmable current fall-time circuit 222, feedback circuit 223, control circuit 224, and pre-driver logic 225.

Pre-driver logic 225 may receive a digital signal from other componentry of IC 210, such as on-board processing logic, that indicates a logical signal to be output from IC 210. Pre-driver logic 225 represents componentry that creates logical signals to control programmable current rise-time circuit 221 and programmable current fall-time circuit 222 such that the desired logical signal is output to I/O pad 220. The output of pre-driver logic 225 determines the logical state that is output to I/O pad 220. However, the rise-time and fall-time of that logical signal is controlled by programmable current rise-time circuit 221 and programmable current fall-time circuit 222.

Programmable current rise-time circuit 221 controls the rising edge of a transition from logical zero to a logical one output to I/O pad 220. Rise-time is the time taken by the digital signal to change from a specified low value to a specified high value; for example, from 10% to 90% of the step size from logical zero to logical one. Programmable current rise-time circuit 221 may control the rise-time of an output signal independently of the fall-time. Therefore, the rise-time may be adjusted independently of the fall-time using programmable current rise-time circuit 221. Programmable current rise-time circuit 221 may allow for the amount of current output by programmable current rise-time circuit 221 to be controlled. By controlling the current output by programmable current rise-time circuit 221, the voltage output will indirectly be controlled. Programmable current rise-time circuit 221 may receive a control signal from control circuit 224. This signal may control the duration of the rise-time. Therefore, control circuit can shorten or lengthen the duration of the rise-time via a control signal provided to programmable current rise-time circuit 221. Programmable current rise-time circuit 221 may control a connection between a connection of I/O pad 220 and a voltage source. By controlling this connection, the amount of in-rush current may be limited and, thus, adjust the rise-time.

Figure 5:
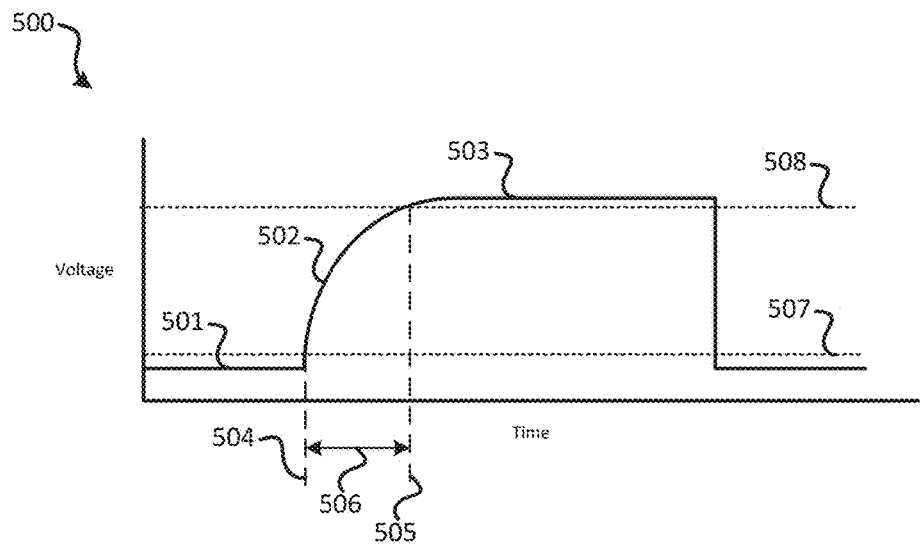
FIG. 5 illustrates an embodiment of a graph of an output signal that has its rise-time controlled by a programmable current rise-time circuit of an on-board circuit for decreasing harmonics of an output digital signal.

FIG. 5 illustrates an embodiment 500 of a graph of a voltage output that has its rise-time controlled by a programmable current rise-time circuit of an on-board circuit for decreasing harmonics of an output digital signal. For example, embodiment 500 may represent an output having its rise-time controlled by a programmable current rise-time circuit 221. The output of a programmable current rise-time circuit may begin at or near logical zero (represented by output signal 501), followed by a rise in voltage over time (output signal 502), followed by a logical one of output signal 503. The rise-time may be measured between low threshold voltage 507, which may be at 10% of the voltage step size, and high threshold voltage 508, which may be at 90% of the voltage step size. The rise-time may be the duration of time between when output signal 502 reaches threshold voltage 507 and threshold voltage 508. Therefore, the difference between time 505 and time 504 determines rise-time 506.

Programmable current fall-time circuit 222 controls the falling edge of a transition from logical one to a logical zero output to I/O pad 220. Fall-time is the time taken by the digital signal to change from a specified high value to a specified low value; for example, from 90% to 10% of the step size from logical one to logical zero. Programmable current fall-time circuit 222 may control the fall-time of an output signal independently of the rise-time. Therefore, the fall-time may be adjusted independently of the rise-time using programmable current fall-time circuit 222. Programmable current fall-time circuit 222 may allow for the amount of current received by programmable current fall-time circuit 222 to be controlled. By controlling the current output or received by programmable current-fall-time circuit 222, the voltage will indirectly be controlled. Programmable current fall-time circuit 222 may receive a control signal from control circuit 224. This signal may control the duration of the fall-time. Therefore, control circuit can shorten or lengthen the duration of the fall-time via a control signal provided to programmable current fall-time circuit 222. Programmable current rise-time circuit 221 may control a connection between a connection of I/O pad 220 and ground. By controlling this connection, the amount of current discharged from a capacitor connected with I/O pad 220 may be limited and, thus, adjust the fall-time.

Figure 6:
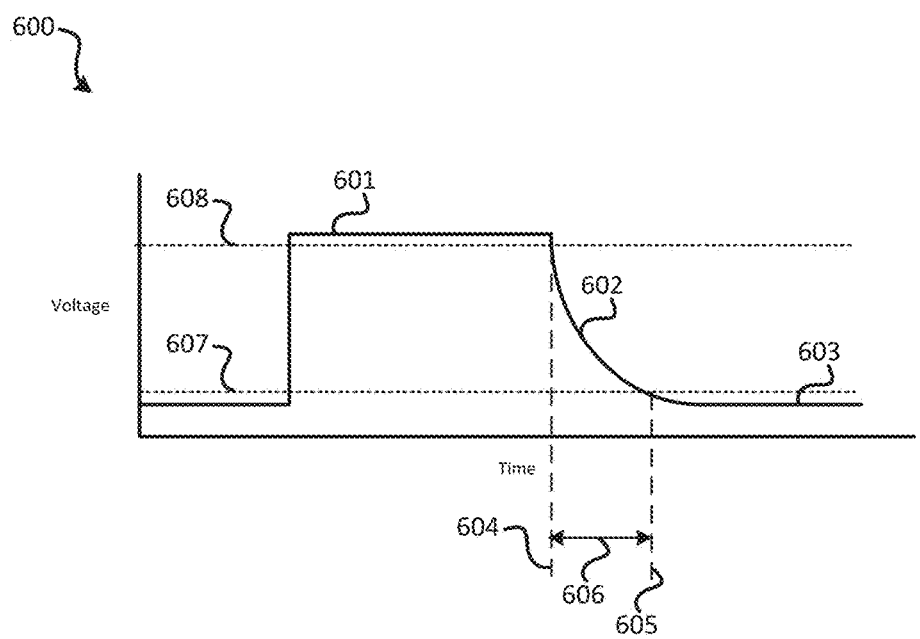
FIG. 6 illustrates an embodiment of a graph of an output signal that has its fall-time controlled by a programmable current fall-time circuit of an on-board circuit for decreasing harmonics of an output digital signal.

FIG. 6 illustrates an embodiment 600 of a graph of an output signal that has its fall-time controlled by a programmable current fall-time circuit of an on-board circuit for decreasing harmonics of an output digital signal. For example, embodiment 600 may represent an output signal that has its fall-time controlled by programmable current fall-time circuit 222. The output of a programmable current fall-time circuit may begin at or near logical one (represented by output signal 601), followed by a fall in voltage over time (output signal 602), followed by a logical one of output signal 603. The fall-time may be measured between high threshold voltage 608, which may be at 90% of the voltage step size, and low threshold voltage 607, which may be at 10% of the voltage step size. (In some embodiments, the percentage of the step size used as the thresholds may be varied.) The fall-time may be the duration of time between when output signal 602 reaches threshold voltage 608 and threshold voltage 607. Therefore, the difference between time 605 and time 604 determines fall-time 606.

Returning to FIG. 2, the output of programmable current rise-time circuit 221 and programmable current fall-time circuit 222 may be combined to create an output signal having a rise-time controlled by programmable current rise-time circuit 221 and a fall-time controlled by programmable current fall-time circuit 222. The output from these two circuits may be output to I/O pad 220. This output may also be electrically connected to feedback circuit 223.

Figure 7:
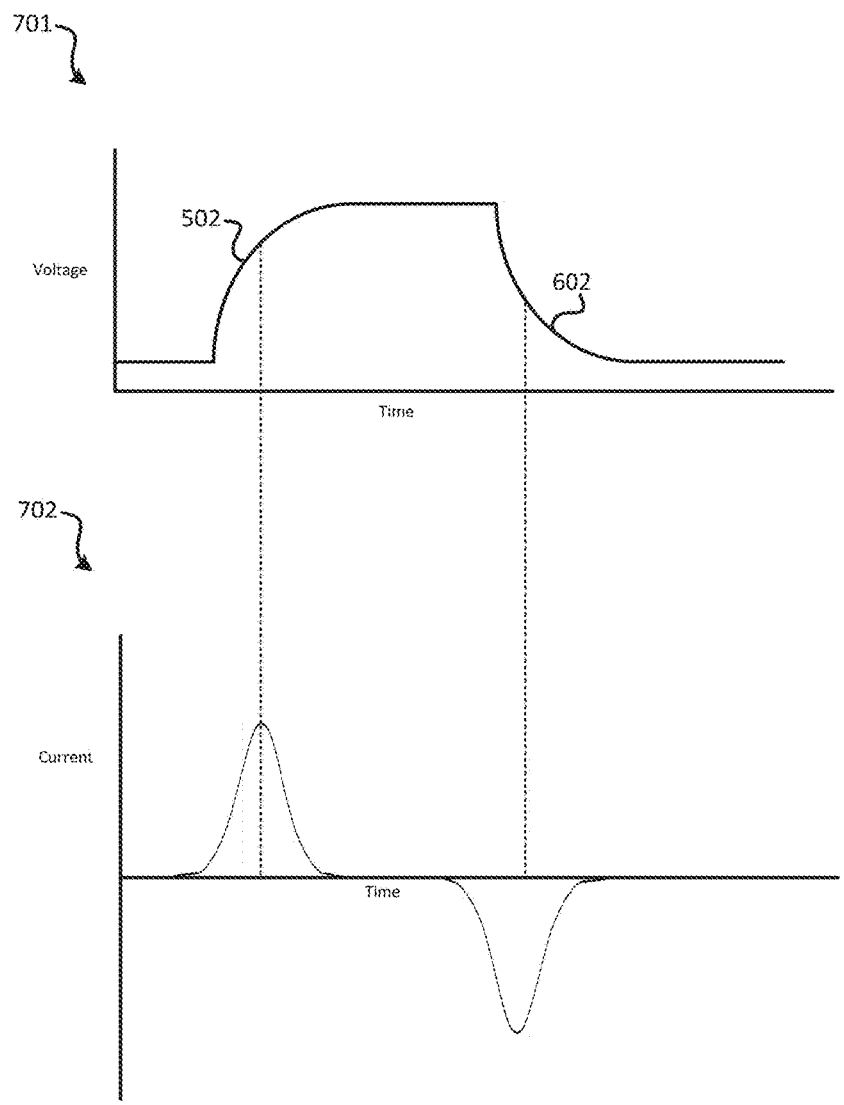
FIG. 7 illustrates a graph of output current and voltage of an on-board circuit for decreasing harmonics of an output digital signal.

FIG. 7 illustrates a graph 701 of an output voltage of an output digital signal that is the combination of the rising edge created by a programmable current rise-time circuit and the falling edge created by a programmable current fall-time circuit. When the rise-time and fall-time of an output digital signal is increased, the harmonics generated by the output current is significantly decreased, thus decreasing the amount of magnetic coupling with other circuits at such harmonic frequencies.

Also illustrated in FIG. 7 is graph 702, which indicates the amount of current of output signal 502 and output signal 602. The current of the output signal as controlled by the programmable current rise-time circuit and the programmable current fall-time circuit may resemble a bell curve. The increase and decrease in current is regulated by programmable current rise-time circuit and the programmable current fall-time circuit, thus resulting the gradual change in voltage reflected in graph 701.

Returning to FIG. 2, feedback circuit 223 may receive the digital output signal from programmable current rise-time circuit 221 and programmable current fall-time circuit 222. Feedback circuit 223 may be used to determine the rise-time and fall-time output by programmable current rise-time circuit 221 and programmable current fall-time circuit 222, respectively. Indication of the duration of the rise-time and fall-time may be output by feedback circuit 223 to control circuit 224. Based upon the duration of the rise-time and fall-time, control circuit 224 may output a control signal to programmable current rise-time circuit 221 to control the rise-time and a separate control signal to variable all-time circuit 222 to control the fall-time. Control circuit 224 may be a circuit that can store data and process received feedback to determine how the variable rise-time and fall-time should be adjusted. Control circuit 224 may be an on-board controller.

Control circuit 224 may store or have access to data that indicates a maximum permissible rise-time and the maximum permissible fall-time. In some embodiments, control circuit 224 may store or have access to data that indicates a range of permissible rise-times and an arrangement of permissible fall-times. Based upon the indications of the durations of rise-times and fall-times received from feedback circuit 223, control circuit 224 may independently increase or decrease the rise-time and/or increase or decrease the fall-time. For example, during operation of IC 210, control circuit 224 may have to occasionally or continually adjust the rise-time and fall-time due to changing operating conditions, such as temperature.

Figure 3:
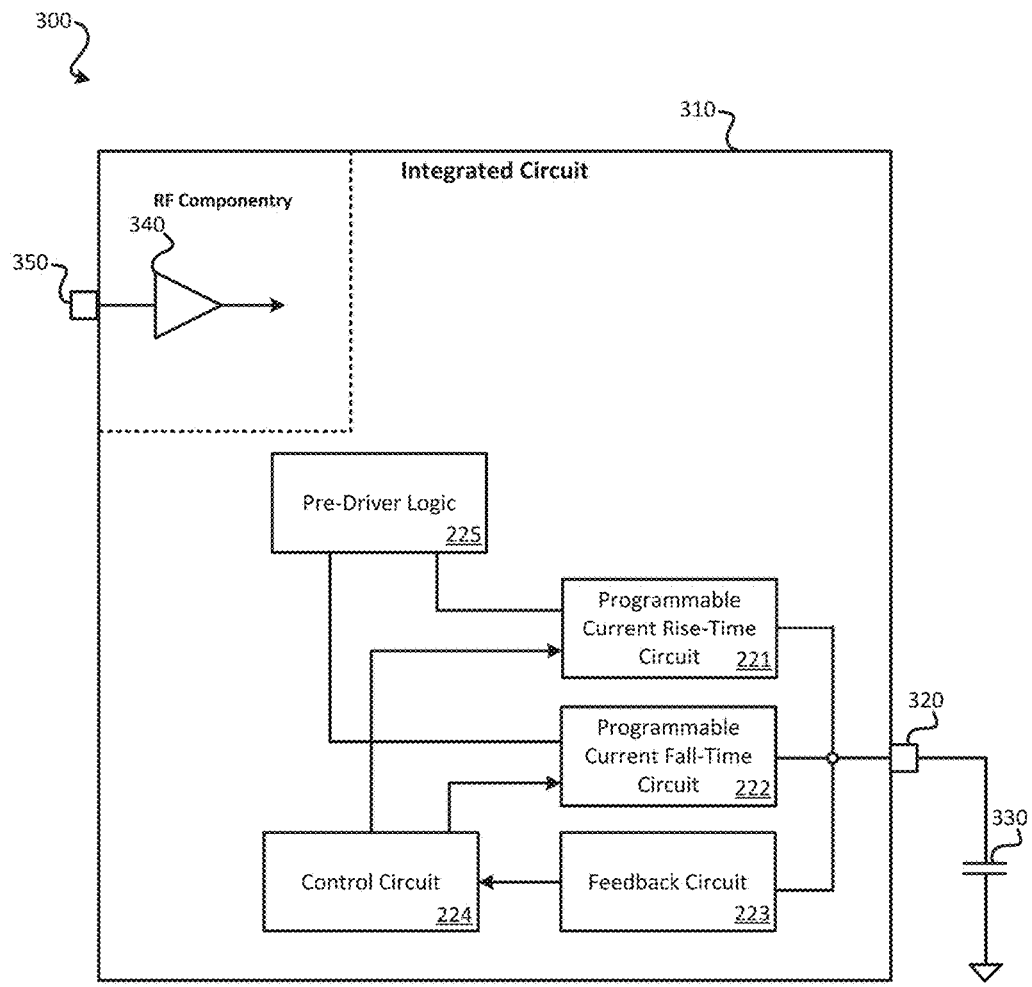
FIG. 3 illustrates another embodiment of a block diagram of an IC having an on-board circuit for decreasing harmonics of an output digital signal.

FIG. 3 illustrates an embodiment 300 of a block diagram of an IC having an on-board circuit for decreasing harmonics of an output digital signal. Embodiment 300 can represent a more detailed embodiment of embodiment 200 of FIG. 2. Embodiment 300, programmable current rise-time circuit 221, programmable current fall-time circuit 222, feedback circuit 223, control circuit 224, and pre-driver logic 225 function as detailed in relation to embodiment 200. On-board integrated circuit 310 may be RF componentry. RF componentry may be particularly sensitive to induced current caused by magnetic loop coupling of harmonics of output digital signals. Embodiment 300, the RF componentry of integrated circuit 310 includes low noise amplifier 340. Low noise amplifier 340 may be electrically connected with I/O pad 350. I/O pad 350 may be electrically connected with sensitive RF componentry, such as an antenna to receive a low-power wireless signal. For example, the low-power wireless signal received and amplified by low noise amplifier 340 may be a Bluetooth® low energy (BLE) signal. The on-board circuit for decreasing harmonics of the output digital signal of IC 310 may be used to decrease the magnetic coupling of harmonics of the digital output signal output to I/O pad 320 with I/O pad 350. Therefore, an on-board circuit for decreasing harmonics of an output digital signal may be used for decreasing magnetic coupling between circuits connected with the same integrated circuit. However, it should be understood that in other embodiments, the on-board circuit for decreasing harmonics of an output digital signal may be used to decrease magnetic coupling of harmonics of digital output signals between distinct circuits, such as circuits connected with different ICs. The amount of magnetic coupling may be proportional to the distance between the circuits exhibiting such coupling. Therefore, the closer together, the more likely that magnetic coupling between circuits will occur.

FIG. 3 also illustrates capacitor 330. Capacitor 330 may represent one or more discrete capacitors that are electrically connected to I/O pad 320. Additionally or alternatively, capacitor 330 may represent capacitance of other forms of componentry that are connected with I/O pad 320. For instance, a long trace along a PCB may exhibit an amount of capacitance.

Figure 4:
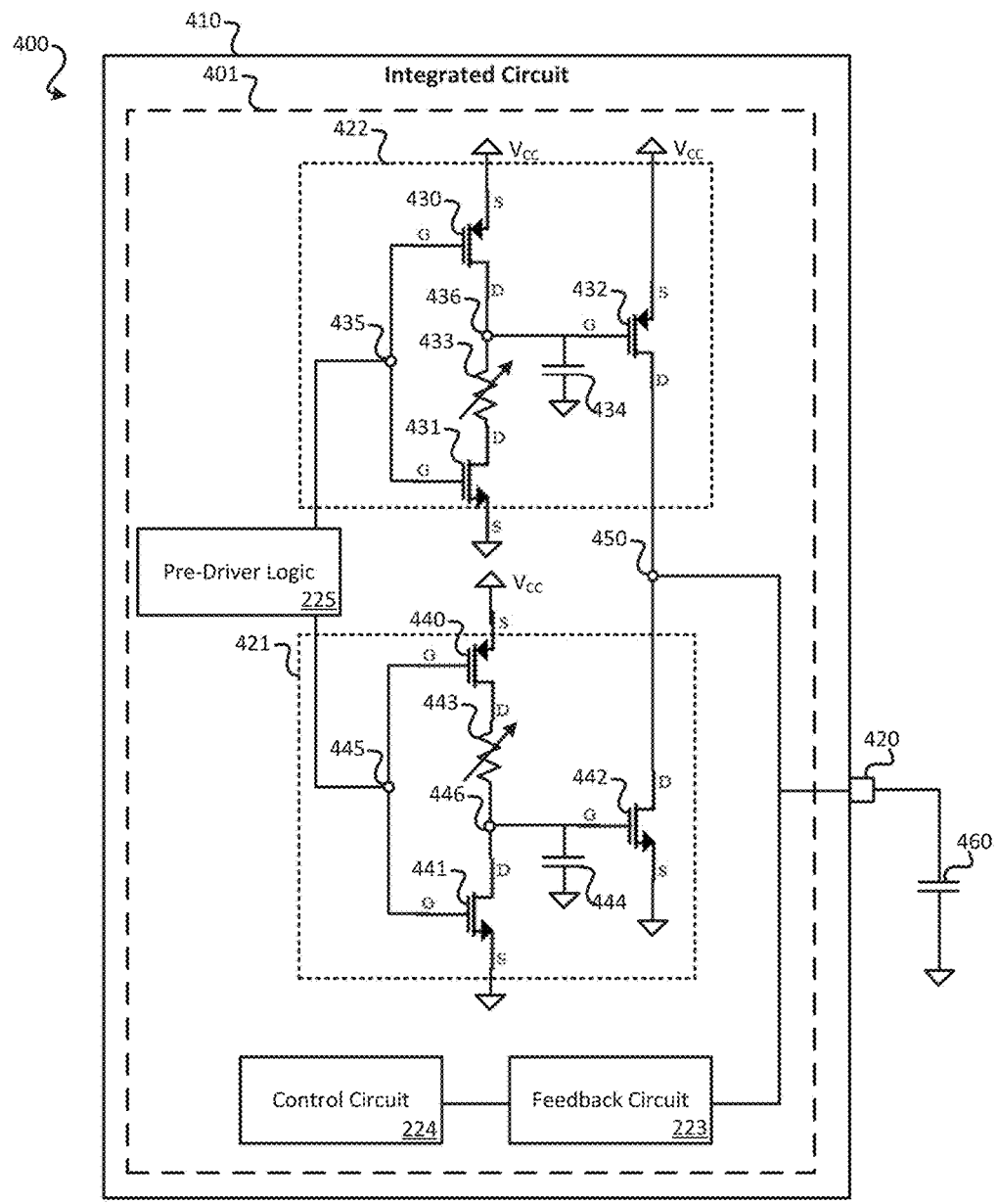
FIG. 4 illustrates an embodiment of a circuit diagram of an IC having an on-board circuit for decreasing harmonics of an output digital signal.

FIG. 4 illustrates an embodiment 400 of a circuit diagram of an IC 410 having an on-board circuit 401 for decreasing harmonics of an output digital signal. Embodiment 400 may represent a more detailed embodiment of embodiments 200 and/or 300. On-chip circuit 401 may include programmable current fall-time circuit 421, programmable current rise-time circuit 422, feedback circuit 223, control circuit 224, and pre-driver logic 225. Feedback circuit 223, control circuit 224, and pre-driver logic 225 may function as detailed in relation to embodiment 200.

Programmable fall-time circuit 421 may include: MOSFET 440, MOSFET 441, MOSFET 442, variable resistor 443, and capacitor 444. MOSFET 440 may be a P-channel MOSFET. MOSFET 440 may have: its gate connected to node 445, which is connected to pre-driver logic 225, its source connected to a voltage source (e.g., $V_{CC}$), and its drain connected to a first terminal of variable resistor 443. MOSFET 441 may be an N-channel MOSFET. MOSFET 441 may have: its gate connected to node 445, its source connected to ground, and its drain connected to node 446.

Variable resistor 443 may have a first terminal connected to the drain of MOSFET 440 and its second terminal connected to node 446. A separate input not illustrated in embodiment 400 is a control signal to variable resistor 443 for varying the resistance of variable resistor 443. Variable resistor 443 may be a digital potentiometer made of a network of resistive switches. Based upon an input digital control signal, the resistance of variable resistor 443 is varied. The control signal may be output by control circuit 224 to variable resistor 443.

MOSFET 442 may be an N-channel MOSFET having: its gate connected to node 446, its source connected to ground, and its drain connected to node 450, which is the output of on-board circuit 401. Additionally, capacitor 444 may be connected with node 446.

Programmable current rise-time circuit 422 may include: MOSFET 430, MOSFET 431, MOSFET 432, variable resistor 433, and capacitor 434. MOSFET 430 may be a P-channel MOSFET. MOSFET 430 may have: its gate connected to node 435, which is connected to pre-driver logic 225, its source connected to a voltage source (e.g., $V_{CC}$), and its drain connected to node 436. MOSFET 431 may be an N-channel MOSFET. MOSFET 431 may have: its gate connected to node 435, its source connected to ground, and its drain connected to a first terminal of variable resistor 433.

Variable resistor 433 may have a first terminal connected to the drain of MOSFET 431 and its second terminal connected to node 436. A separate input not illustrated in embodiment 400 is a control signal to variable resistor 433 for varying the resistance of variable resistor 433. Variable resistor 433 may be a digital potentiometer made of a network of resistive switches. Based upon an input digital control signal, the resistance of variable resistor 433 is varied. The control signal may be output by control circuit 224 to variable resistor 433. Variable resistor 433 may be controlled by control circuit 224 independently of variable resistor 443.

MOSFET 432 may be a P-channel MOSFET having: its gate connected to node 436, its source connected to a voltage source ($V_{CC}$), and its drain connected to node 450, which is the output of on-board circuit 401. Additionally, capacitor 434 may be connected with node 436.

When pre-driver logic 225 provides a signal to node 445 that transitions from logical zero to logical one, MOSFET 441 conducts from drain to source, while MOSFET 440 is open from drain to source. This state causes MOSFET 442 to turn off (function as an open circuit) quickly. When pre-driver logic 225 provides a signal to node 435 that transitions from logical zero to logical one, MOSFET 431 conducts from drain to source, while MOSFET 430 is open from drain to source. The charge of capacitor 434 discharges to ground through variable resistor 433 and MOSFET 431. The resistance of variable resistor 433 alters the rate of discharging. As capacitor 434 gradually discharged, the voltage at the gate of MOSFET 432 transitions from a logical one to a logical zero, gradually closing MOSFET 432 such that node 450 is connected to $V_{CC}$ through MOSFET 432. Since node 450 is gradually connected to $V_{CC}$, the current drawn to charge capacitor 460 is decreased (thus decreasing the creation of a magnetic loop that induces current in other circuits via magnetic coupling). The slower that MOSFET 432 is turned on, the longer the rise-time of the digital output signal output to I/O pad 420. Capacitor 460 can represent one or more discrete capacitors electrically connected with I/O pad 420 and/or other componentry electrically connected with I/O pad 420 that exhibits capacitance.

When pre-driver logic 225 provides a signal to node 435 that transitions from logical one to logical zero, MOSFET 430 conducts from drain to source, while MOSFET 431 is open from drain to source. This state causes MOSFET 432 to turn off (function as an open circuit) quickly. When pre-driver logic 225 provides a signal to node 445 that transitions from logical one to logical zero, MOSFET 440 conducts from drain to source, while MOSFET 441 is open from drain to source. Capacitor 444 is then slowly charged to $V_{CC}$ through MOSFET 440 and variable resistor 443. The resistance of variable resistor 443 alters the rate of charging. As capacitor 444 is gradually charged, the voltage at the gate of MOSFET 442 transitions from a logical zero to a logical one, gradually closing MOSFET 432 such that node 450 is connected to ground through MOSFET 442. Since node 450 is gradually connected to ground, the current discharged by capacitor 460 is decreased (thus decreasing the creation of a magnetic loop that induces current in other circuits via magnetic coupling). The slower that MOSFET 442 is turned on, the longer the fall-time of the digital output signal at I/O pad 420.

Feedback circuit 223 may be connected with node 450. As such, feedback circuit 223 can monitor the rise-time and fall-time of the digital output signal at I/O pad 420. Indications of the measured rise-time and measured fall-time may be output to control circuit 224. Based on the measured rise-time, control circuit 224 can adjust the resistance of variable resistor 433. If a longer rise-time is desired, the resistance of variable resistor 433 may be increased to increase the discharge time of capacitor 434. By increasing the discharge time of capacitor 434, the amount of time that MOSFET 432 takes to transition from open to closed may be increased, thus decreasing the amount of current from $V_{CC}$ to charge capacitor 460 and effectively increasing the rise-time of the output digital signal. Based on the measured fall-time, control circuit 224 can adjust the resistance of variable resistor 443. If a longer fall-time is desired, the resistance of variable resistor 443 may be increased to increase the charge time of capacitor 444. By increasing the charge time of capacitor 444, the amount of time that MOSFET 442 takes to transition from open to closed may be increased, thus decreasing the amount of current discharged from capacitor 460 to ground through MOSFET 442 and effectively increasing the fall-time of the output digital signal. Control circuit 224 may store an indication of a desired rise-time and a separate indication of a desired fall-time. The resistance of variable resistors 433 and 443 may be controlled in accordance with these desired rise and fall-times. The desired rise and fall-times may be matched to the maximum (or near maximum) of another device's tolerance for rise and fall-times that uses the digital signal from I/O pad 420 as an input.

Of note, the componentry of embodiment 400 that allow for the adjustable current rise-time and fall-time does not require any static bias current. As such, when such circuitry is not active, the circuitry does not consume any additional power (besides power usage due to a small amount of leakage current) than a conventional output circuit without active control of the current rise and fall times. Therefore, the circuitry may be incorporated as part of integrated circuit 410 with little or no change in the power requirements of IC 410.

Figure 8:
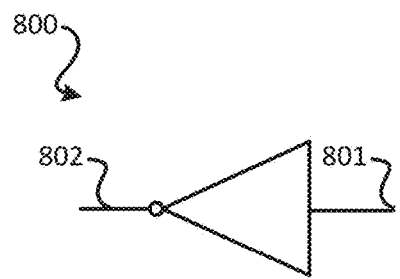
FIG. 8 illustrates an embodiment of feedback circuit that can be incorporated as part of a self-calibrating circuit for decreasing harmonics of an output digital signal.

FIG. 8 illustrates an embodiment of feedback circuit 800 that can be incorporated as part of a self-calibrating circuit for decreasing harmonics of an output digital signal. By incorporating a form of feedback, the circuit for decreasing harmonics for an output digital signal is self-calibrating in that it can adjust a rise-time and fall-time as necessary to meet certain parameters. For example, rise-time and fall-time may be maximized up to a threshold duration for each. Feedback circuit 800 may be an inverter. Input 801 may be connected to an output of programmable current rise-time circuit 221 and programmable current fall-time circuit 222 of FIG. 2 or node 450 of FIG. 4. Output 802 may be connected with a control circuit, such as control circuit 224. In such an embodiment, control circuit 224 may be connected with pre-driver logic 225 or another source of a digital signal for comparison with the output of the inverter functioning as feedback circuit 800, such as an input to pre-driver logic 225. By measuring a delay in transition from logical zero to logical one between the input signal to pre-driver logic 225 and output 802, the rise-time may be determined. By measuring a delay in transition from logical one to logical zero between the input signal to pre-driver logic 225 and output 802, the fall-time may be determined. Based upon these determined rise and fall-times by the control circuit, the rise-time and/or fall-time can be lengthen, shortened, or kept the same in duration.

Figure 9:
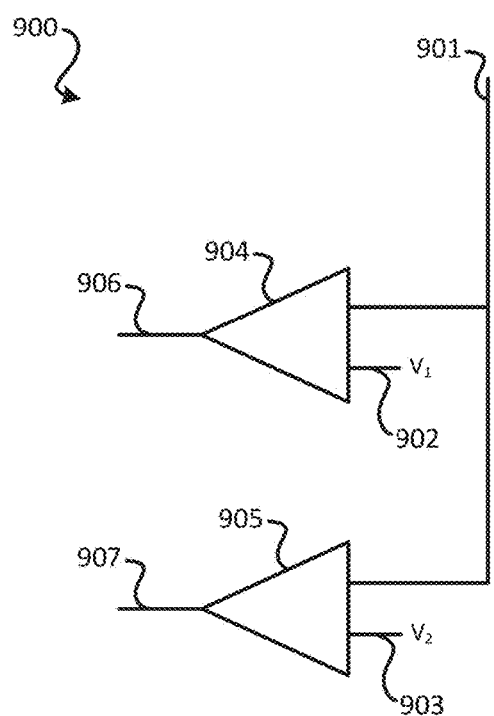
FIG. 9 illustrates a different embodiment of feedback circuit that can be incorporated as part of a self-calibrating circuit for decreasing harmonics of an output digital signal.

FIG. 9 illustrates an embodiment of feedback circuit 900 that can be incorporated as part of a self-calibrating circuit for decreasing harmonics of an output digital signal. Input 901 may be connected to an output of programmable current rise-time circuit 221 and programmable current fall-time circuit 222 of FIG. 2 or node 450 of FIG. 4. Comparator 904 and comparator 905 may be used to compare the voltage at input 901 to threshold voltage 902 and threshold voltage 903. Threshold voltage 902 may be a low voltage (e.g., 10% of the voltage step size) and threshold voltage 903 may be a high voltage (e.g., 90% of the voltage step size). The duration of time from when the signal at input 901 transitions from below threshold voltage 902 to above threshold voltage 903 may represent the rise-time. The duration of time from when the signal at input 901 transitions from above threshold voltage 903 to below threshold voltage 902 may represent the fall-time. A control circuit, such as control circuit 224, may monitor outputs 906 and 907 to determine the rise-time and fall-time of the signal at input 901. Based upon these determined rise and fall-times by the control circuit, the rise-time and/or fall-time can be lengthen, shortened, or kept the same in duration.

Regardless of the type of feedback circuit used, in some embodiments, the control circuit may individually adjust the resistance of variable resistors 433 and 443 of circuit 401 of FIG. 4. Control circuit 224 may store a data arrangement that relates rise-times and fall-times to adjustments in resistance. For example, if the rise-time is to be increased by an amount of time, control circuit 224 may be able to calculate or look up the amount by which the resistance of variable resistor 433 should be changed. Control circuit 224 may send a digital message to variable resistor 433 to adjust the resistance.

Figure 10:
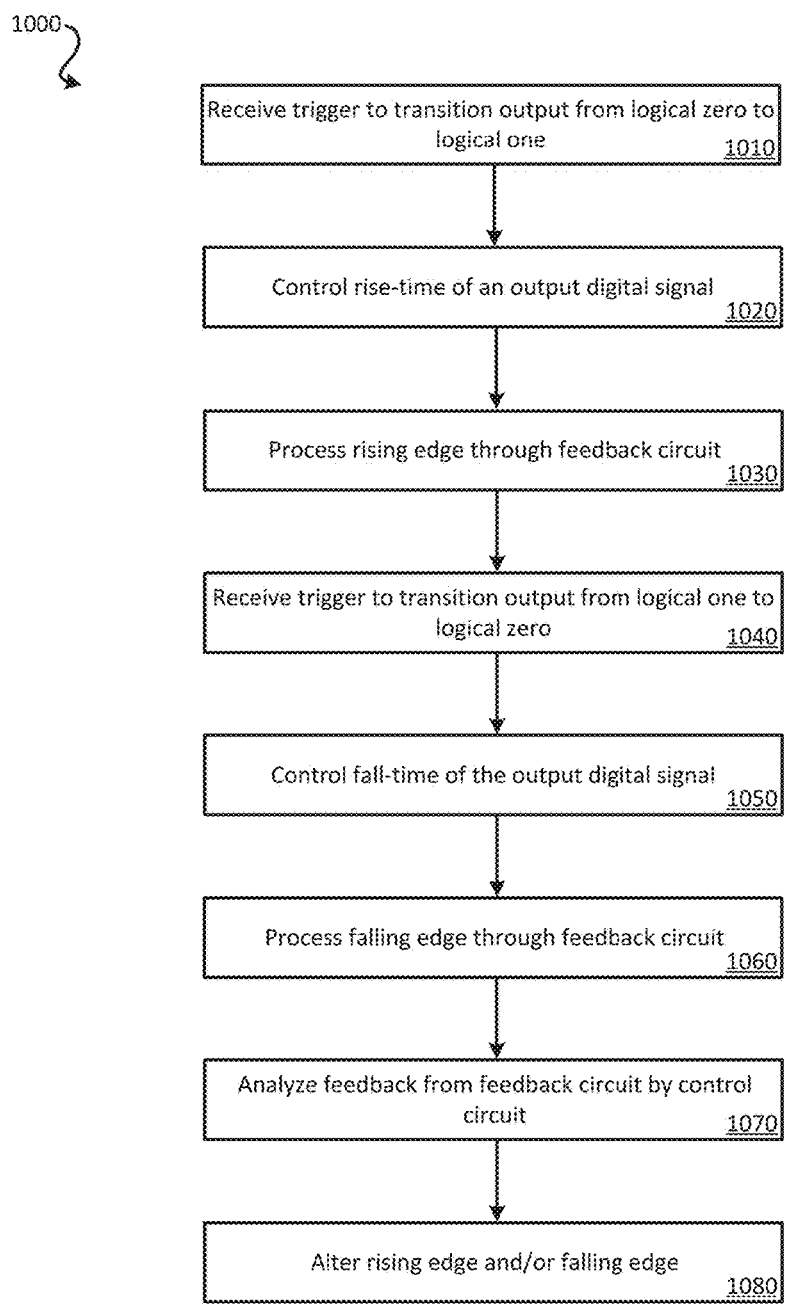
FIG. 10 illustrates an embodiment of a method for self-calibrating the rise-time and fall-time of an output digital signal.

FIG. 10 illustrates an embodiment of a method 1000 for self-calibrating the rise-time and fall-time of an output digital signal. Method 1000 may be performed using the circuits detailed to relation to FIGS. 2-4, 8, and 9. At block 1010, a trigger signal receives transition and output of the integrated circuit from logical zero to logical one. This trigger signal may be a digital input signal that may be received from other circuitry of the integrated circuit. The trigger signal may be received by pre-driver logic that drives a programmable current rise-time circuit and a programmable current fall-time circuit.

At block 1020, the rise-time of the output digital signal may be controlled by a programmable current rise-time circuit. The rise-time of the output digital signal may be adjusted by how quickly the output of the integrated circuit is connected with a voltage source. By connecting the output of the integrated circuit to the voltage source slowly, the amount of current drawn by components off of the integrated circuit, such as one or more capacitors or componentry that exhibit capacitance, may be controlled. By decreasing this current, the magnitude of harmonics is decreased and, thus, the magnitude of magnetic coupling between circuits at such harmonic frequencies is decreased.

At block 1030, the rising edge of the output digital signal controlled at block 1020 may be processed by a feedback circuit, such as those detailed in feedback circuits 800 and 900. An indication of the duration of the rise-time may be provided to a control circuit.

At block 1040, a trigger signal received transition and output of the integrated circuit from logical one to a logical zero. At block 1050, the fall-time of the output digital signal may be controlled by a programmable current fall-time circuit. The fall-time of the output digital signal may be adjusted by how quickly the output of the integrated circuit is connected with ground. By connecting the output of the integrated circuit to ground slowly, the amount of current output by components off of the integrated circuit, such as one or more capacitors or componentry that exhibit capacitance, to ground may be controlled. By decreasing this current, the magnitude of harmonics is decreased and, thus, the magnitude of magnetic coupling between circuits at such harmonic frequencies is decreased.

At block 1060, the falling edge of the output digital signal controlled at block 1050 may be processed by a feedback circuit. An indication of the duration of the fall-time may be provided to a control circuit. At block 1070, the control circuit may analyze the feedback received from the feedback circuit. The feedback from the feedback circuit may be analyzed to determine the duration of the rise-time in the duration of the fall-time. The control circuit may have stored or have access to an indication of a desired rise-time and fall-time or an acceptable range for the rise-time and fall-time. The rise-time and fall-time may differ from each or may be the same. At block 1080, the control circuit may alter the durations of the rise-time and/or fall-time by providing input to programmable current rise-time circuit and programmable current fall-time circuit. For example, the control circuit may adjust the resistance of a variable resistor in each circuit that controls the rate at which the output signal is connected with a voltage source or ground, which in turn, controls the rise-time and fall-time, respectively.

Figure 11:
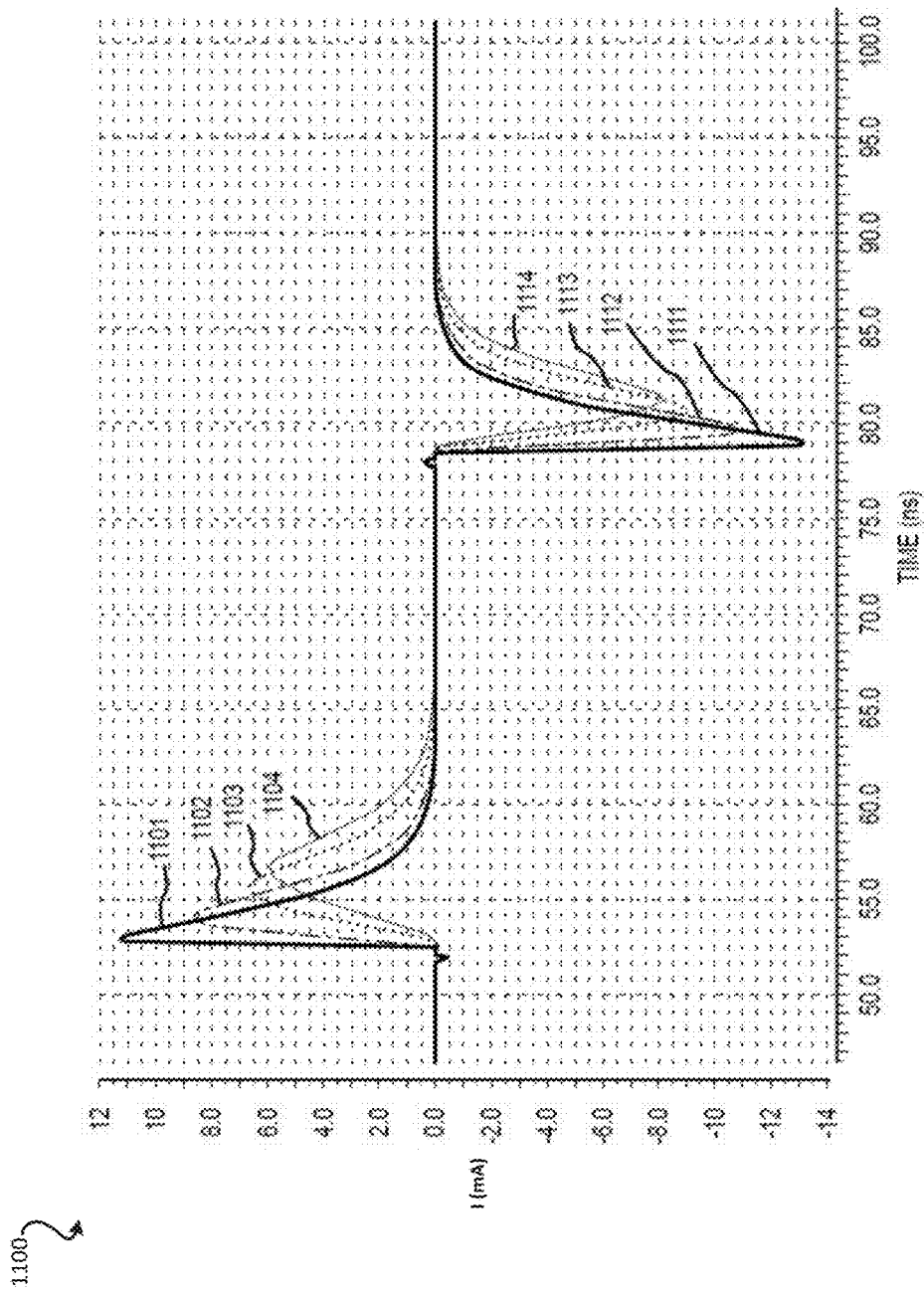
FIG. 11 is a graph of the current observed at a I/O pad during two logic transitions.

FIG. 11 is a graph 1100 of the current observed at an I/O pad during two logic transitions. The current measurements of graph 1100 may be measured based on the output of an on-board circuit for decreasing harmonics of an output digital signal, such as that of FIGS. 2-4. In FIG. 11, a logical transition from zero to one occurs at approximately 53 ns; and a logical transition from one to zero occurs at approximately 78 ns. Current measurements 1101-1104 indicate varying current measurements depending on the amount of delay applied to a current rise-time of a digital output. Current measurement 1101, which has a peak value of 11.25 mA, represents no control delay to current rise-time being applied. Current measurements 1102, 1103, and 1104 (which have peak values of 8.5 mA, 6.6 mA, and 5.9 mA, respectively) represent incrementally increased delay in the current rise-time of the output digital signal. Referring to FIG. 4, increasing the resistance of resistor 433 would increase the delay in current rise-time and also decrease the peak current value observed at the output as part of the transition.

Further, in FIG. 11, regarding the logical transition from logical one to zero at approximately 78 ns, the reverse current is observed as current from capacitors connected with the I/O pad is discharged. The current of current measurements 1111-1114 can be controlled separately from current measurements 1101-1104. The current measurements 1111-1114 can be controlled separately by adjusting the current fall-time circuit. Current measurements 1111-1114 indicate varying current measurements depending on the amount of control applied to a current fall-time of a digital output. Current measurement 1111, which has a minimal value of −13.1 mA, represents no control delay to current fall-time being applied. Current measurements 1112, 1113, and 1114 (which have minimum values of −11 mA, −9 mA, and −8.1 mA, respectively) represent incrementally increased delay in the current fall-time of the output digital signal. Referring to FIG. 4, increasing the resistance of resistor 443 would increase the delay in current fall-time and also increase the minimum current value (that is, have a smaller magnitude) observed at the output as part of the transition.

Figure 12:
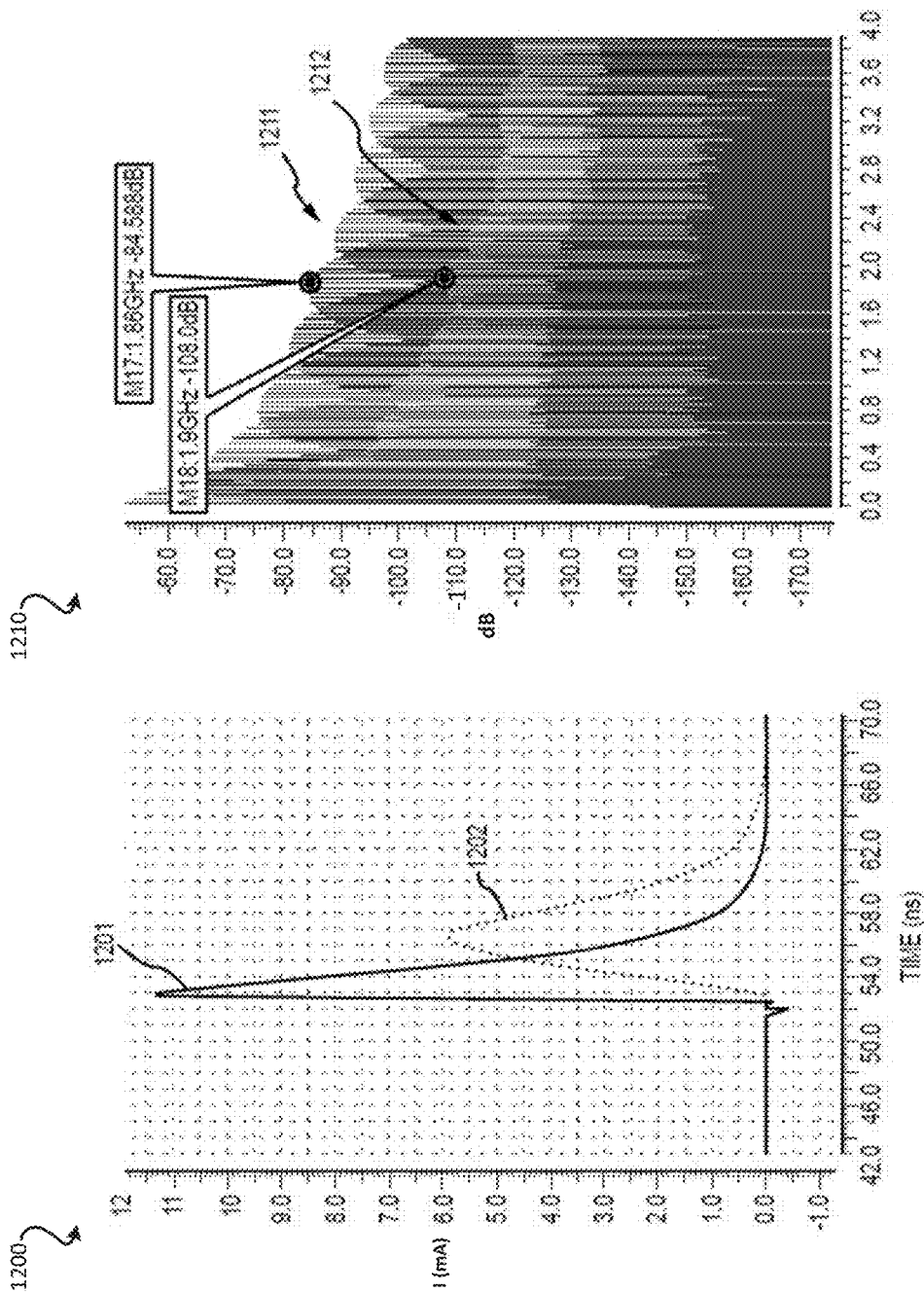
FIG. 12 illustrates two graphs that present the effect of an increased current rise time on harmonics observed between 0 and 4 GHz.

FIG. 12 illustrates two graphs (1200, 1210) that illustrates the effect of an increased current rise time on harmonics observed between 0 and 4 GHz. Graph 1200 represents the current observed at an I/O pad during a logic transition from zero to one. The current measurements of graph 1200 are made from the output of an on-board circuit for decreasing harmonics of an output digital signal, such as that of FIGS. 2-4. Current measurement 1201, which has a peak value of 11.25 mA, represents no control delay to current rise-time being applied. Current measurements 1202, which has a peak value of 5.9 mA, represents an increased delay in the current rise-time of the output digital signal. This increased delay in current rise time decreases the peak current output by the on-board circuit for decreasing harmonics of the output digital signal.

Graph 1210 illustrates the effect of increasing the current rise-time and decreasing the peak current output at various harmonic frequencies between 0 and 4 GHz at the output at which current measurements 1201, 1202 were made. Power measurements 1211 correspond to current measurements 1201 and power measurements 1212 correspond to current measurements 1202. At a frequency of approximately 1.9 GHz, −108 dB is present for current measurements 1202, which has its current rise-time being controlled. At a frequency of approximately 1.9 GHz, −84.5 dB is present for current measurements 1201, which does not have its current rise-time controlled. As such, by controlling the current rise-time such as in graph 1210, a 10× power decrease in the harmonic output can be realized. A greater or lesser power decrease in the power of the harmonics can be realized by increasing or decreasing the rise-time delay, respectively. Similar results can be achieved for the fall-time.

The methods, systems, and devices discussed above are examples. Various configurations may omit, substitute, or add various procedures or components as appropriate. For instance, in alternative configurations, the methods may be performed in an order different from that described, and/or various stages may be added, omitted, and/or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations will provide those skilled in the art with an enabling description for implementing described techniques. Various changes may be made in the function and arrangement of elements without departing from the spirit or scope of the disclosure.

Also, configurations may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Having described several example configurations, various modifications, alternative constructions, and equivalents may be used without departing from the spirit of the disclosure. For example, the above elements may be components of a larger system, wherein other rules may take precedence over or otherwise modify the application of the invention. Also, a number of steps may be undertaken before, during, or after the above elements are considered.

What is claimed is:

1. A system for decreasing harmonics of an output digital signal, the system comprising:
    an integrated circuit (IC), comprising:
        a programmable current rise-time circuit that controls a rising edge of the output digital signal, wherein the output digital signal is output to an input/output (I/O) pad;
        a programmable current fall-time circuit that controls a falling edge of the output digital signal;
        a feedback circuit that monitors a rise-time of the rising edge of the output digital signal and fall-time of the falling edge of the output digital signal;
        a control circuit that provides a first input to the programmable current rise-time circuit to adjust the rise-time of the rising edge of the output digital signal and a second input to the programmable current fall-time circuit to adjust the fall-time of the falling edge of the output digital signal; and
        an RF input connected with a low noise amplifier (LNA) of the IC, wherein the control circuit using the programmable current rise-time circuit to increase the rise-time of the rising edge and the programmable current fall-time circuit to increase the fall-time of the falling edge reduces magnetic coupling between the output digital signal and the RF input.

2. The system for decreasing harmonics of the output digital signal of claim 1, wherein the system further comprises the I/O pad located on a printed circuit board and the I/O pad is electrically connected to one or more capacitors distinct from the IC.

3. A system for decreasing harmonics of an output digital signal, the system comprising:
    a programmable current rise-time circuit that controls a rising edge of the output digital signal, wherein the output digital signal is output to an input/output (I/O) pad, wherein the programmable current rise-time circuit comprises:
        a first p-channel metal-oxide semiconductor field-effect transistor (MOSFET) comprising: a first gate; a first source; and a first drain;
        an n-channel MOSFET comprising: a second gate; a second source; and a second drain;
        a second p-channel MOSFET comprising: a third gate; a third source; and a third drain;
        a capacitor; and
        a variable resistance network comprising a first terminal and a second terminal, wherein:
        the first gate and the second gate are electrically connected to a first node, wherein the first node is also electrically connected to a logic circuit of the IC;
        the first drain, the third gate, the capacitor, and the first terminal of the variable resistance network are electrically connected to a second node; and
        the second drain and the second terminal are electrically connected;
    a programmable current fall-time circuit that controls a falling edge of the output digital signal;
    a feedback circuit that monitors a rise-time of the rising edge of the output digital signal and fall-time of the falling edge of the output digital signal; and
    a control circuit that provides a first input to the programmable current rise-time circuit to adjust the rise-time of the rising edge of the output digital signal and a second input to the programmable current fall-time circuit to adjust the fall-time of the falling edge of the output digital signal.

4. The system for decreasing harmonics of the output digital signal of claim 3, wherein the third drain is electrically connected with the I/O pad.

5. A system for decreasing harmonics of an output digital signal, the system comprising:
   a programmable current rise-time circuit that controls a rising edge of the output digital signal, wherein the output digital signal is output to an input/output (I/O) pad;
   a programmable current fall-time circuit that controls a falling edge of the output digital signal, wherein the programmable current fall-time circuit comprises:
      a p-channel metal-oxide semiconductor field-effect transistor (MOSFET) comprising: a first gate; a first source; and a first drain;
      a first n-channel MOSFET comprising: a second gate; a second source; and a second drain;
      a second n-channel MOSFET comprising: a third gate; a third source; and a third drain;
      a capacitor; and
      a variable resistance network comprising a first terminal and a second terminal, wherein:
      the first gate and the second gate are electrically connected to a first node, wherein the first node is also electrically connected to a logic circuit of the IC;
      the second drain, the third gate, the capacitor, and the first terminal of the variable resistance network are electrically connected to a second node; and
      the first drain and the second terminal of the variable resistance network are electrically connected;
   a feedback circuit that monitors a rise-time of the rising edge of the output digital signal and fall-time of the falling edge of the output digital signal; and
   a control circuit that provides a first input to the programmable current rise-time circuit to adjust the rise-time of the rising edge of the output digital signal and a second input to the programmable current fall-time circuit to adjust the fall-time of the falling edge of the output digital signal.

6. The system for decreasing output harmonics of the digital signal of claim 5, wherein the third drain is electrically connected with the I/O pad.

7. The system for decreasing output harmonics of the digital signal of claim 1, wherein:
   the feedback circuit comprises an inverter;
   an input of the inverter is electrically connected with the I/O pad; and
   an output of the inverter is electrically connected with the control circuit, wherein the control circuit determines the first input and the second input at least partially based on the output of the inverter.

8. The system for decreasing output harmonics of the digital signal of claim 5, wherein: the variable resistance network comprises a control input electrically connected with the control circuit.

9. The system for decreasing output harmonics of the digital signal of claim 1, wherein the programmable current rise-time circuit and the programmable current fall-time circuit do not use a biasing current.

10. An apparatus for decreasing harmonics of an output digital signal, the apparatus comprising:
    a first means for controlling a rising edge of a current of the output digital signal;
    a second means for controlling a falling edge of the current of the output digital signal;
    a feedback means that monitors a rise-time of the rising edge of the output digital signal and fall-time of the falling edge of the output digital signal;
    a control means that provides a first input to the first means to adjust the rise-time of the rising edge of the current of the output digital signal and a second input to second means to adjust the fall-time of the falling edge of the current of the output digital signal; and
    an RF input means connected with a low noise amplifier (LNA), wherein the control means using the first means to increase the rise-time of the rising edge and the second means to increase the fall-time of the falling edge reduces magnetic coupling between the output digital signal and the RF input means.

* * * * *